United States Patent
Takenaka

(10) Patent No.: US 6,791,135 B2
(45) Date of Patent: Sep. 14, 2004

(54) SEMICONDUCTOR DEVICE WITH IMPROVED CAPACITIVE ELEMENT AND METHOD OF FORMING THE SAME

(75) Inventor: Motohiro Takenaka, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/390,915

(22) Filed: Mar. 19, 2003

(65) Prior Publication Data

US 2003/0178665 A1 Sep. 25, 2003

(30) Foreign Application Priority Data

Mar. 19, 2002 (JP) ........................................ 2002-075457

(51) Int. Cl.[7] .................. H01L 27/108; H01L 21/8234
(52) U.S. Cl. .................. 257/296; 257/298; 257/300; 257/306; 257/908; 438/238; 438/239; 438/386; 438/399
(58) Field of Search ................................ 257/296, 298, 257/300, 306, 908; 438/238, 239, 386, 399

(56) References Cited

U.S. PATENT DOCUMENTS 6,294,420 B1 * 9/2001 Tsu et al. .................. 438/239
2001/0032993 A1 * 10/2001 Tsugane et al. ............. 257/306

FOREIGN PATENT DOCUMENTS

| JP | 11-87639 | 3/1999 |
| JP | 11-354750 | 12/1999 |

* cited by examiner

*Primary Examiner*—Donghee Kang
(74) *Attorney, Agent, or Firm*—Young & Thompson

(57) ABSTRACT

A semiconductor device includes: a digital circuit including a first capacitive element of metal-insulator-metal structure, and an analogue circuit including a second capacitive element of metal-insulator-metal structure. Bottom electrodes, capacitive insulation layers, and top electrodes of the first and second capacitive elements are formed in the same or common processes to each other. The bottom electrodes are electrically connected with contacts in an underlying inter-layer insulator. The top electrodes are electrically connected with other contacts in an overlying inter-layer insulator.

12 Claims, 15 Drawing Sheets

SEMICONDUCTOR DEVICE WITH IMPROVED CAPACITIVE ELEMENT AND METHOD OF FORMING THE SAME

BACKGROUND OF THE INVENTION

1. Field of the Invention

The present invention relates to a semiconductor device and a method of forming the same, and more particularly to a semiconductor device integrating at least a memory circuit and at least an analogue circuit which includes an improved capacitive element, and a method of forming the same.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

In recent years, a large number of a semiconductor device, which comprises a logic circuit hybridized with a memory circuit, have been designed for response to various purposes and applications. For example, a DRAM-hybrid logic circuit has been provided, wherein DRAM cells integrated into a logic circuit. Capacitive elements may, in case, be needed for not only a digital circuit which constitutes the DRAM cells but also an analogue circuit which constitutes the logic circuit. The capacitive element included in the analogue circuit for the logic circuit is formed in a separate process from another process for forming the other capacitive element included in the digital circuits for the DRAM cells. It may be possible that the capacitive element for the DRAM cell utilizes a polycrystalline silicon for at least one of paired top of bottom electrodes of the cell. This capacitive element having one or more polycrystalline silicon electrodes in the DRAM cell is not suitable as the capacitive element for the analogue circuit, in the light of capacitance value dependency upon applied voltage to the capacitive element.

The capacitive element varies in capacitance value, depending upon the variation of the applied voltage. This capacitance value dependency upon applied voltage may not be influential to the DRAM cell but may be influential to the analogue circuit. An ideal capacitive element in the analogue circuit is free of any substantial capacitance value dependency upon applied voltage.

For example, an MOS capacitor includes a part of a substrate and a gate electrode of a MOS transistor. Such MOS capacitor has a substantial capacitance value dependency upon applied voltage. For this reason, such the MOS transistor is unsuitable for the analogue circuit. Also, the capacitor constituting the DRAM cell has a substantial capacitance value dependency upon applied voltage. For this reason, such DRAM cell capacitor is also unsuitable for the analogue circuit. For those reasons, the process for forming the capacitor in the analogue circuit is separated from the process for forming the capacitor in the DRAM circuit.

FIG. 1 is a fragmentary cross sectional elevation view illustrative of a conventional structure of a semiconductor device including a DRAM region and an analogue circuit region in the prior art. The semiconductor device includes a DRAM region 1000 and an analogue circuit region 2000 over a silicon substrate 201. The DRAM region 1000 includes a DRAM cell and its peripheral circuits.

Over the silicon substrate 201, p-well regions 203 and n-well region 204 are selectively formed, so that the p-well regions 203 are isolated from each other by shallow trench isolations 202. The p-well regions 203 are included in the DRAM region 1000 and the analogue circuit region 2000, respectively. The p-well regions 203 are isolated from each other by the n-well region 204.

Over the p-well regions 203 in the DRAM region 1000 and the analogue circuit region 2000, a gate insulation film 205 is formed. Gate electrodes 206 are then formed on the gate insulation film 205. Further, source and drain regions 207 are selectively formed in upper regions of the p-well regions 203 in the DRAM region 1000 and the analogue circuit region 2000, whereby first and second transistors TR11 and TR12 are formed in the DRAM region 1000 and the analogue circuit region 2000, respectively.

An inter-layer insulator 208 is then formed over the p-well regions 203 and the n-well region 204, so that the inter-layer insulator 208 overlies the first and second transistors TR11 and TR12. A planarization to a surface of the inter-layer insulator 208 is then made to form a planarized surface of the inter-layer insulator 208.

A contact hole is formed in the inter-layer insulator 208 in the DRAM region 1000. A contact plug 209 of polysilicon is formed in the contact plug. A silicon oxide film 210 is formed over the planarized surface of the inter-layer insulator 208. A surface of the silicon oxide film 210 is then planarized. Cylinder-shaped holes 216 are formed in the silicon oxide film 210, wherein the cylinder-shaped holes 216 are positioned in the DRAM region 1000 and the analogue circuit region 2000. The cylinder-shaped holes 216 are much larger in diameter than the contact hole, within which the contact plug 209 has been formed. Conductive polysilicon films 211 with surface roughness are formed on bottom and side walls of the cylinder-shaped holes 216. Silicon nitride films 212 are formed on rough surfaces of the conductive polysilicon films 211, wherein the silicon nitride films 212 act as capacitive insulation films.

Conductive polysilicon films 213 are formed on the silicon nitride films 212 and on parts of the planarized surface of the silicon oxide film 210, so that the conductive polysilicon films 213 completely fill the cylinder-shaped holes 216 and also extends over parts of the planarized surface of the silicon oxide film 210, whereby a first capacitor C11 is formed in the DRAM region 1000. In the DRAM region 1000, the conductive polysilicon film 213 acts as a top electrode of the first capacitor C11 in the DRAM region 1000. In the analogue circuit region 2000, the conductive polysilicon film 213 acts as a bottom electrode of a second capacitor C12 to be formed by further processes to be described below.

A capacitive insulation film 214 is selectively formed on a part of a top surface of the conductive polysilicon film 213 in the analogue circuit region 2000. A top electrode 215 of tungsten silicide is selectively formed on the capacitive insulation film 214, whereby the second capacitor C12 is formed in the analogue circuit region 2000.

An inter-layer insulator 217 is formed over the first and second capacitors C11 and C12. A surface of the inter-layer insulator 217 is then planarized. Contact holes are formed in the inter-layer insulator 217, so that the contact holes communicate with the top electrode 213 of the first capacitor C11, the top and bottom electrodes 215 and 213 of the second capacitor C12. Contact plugs 218 are then formed on the contact holes, so that the contact plugs 218 are connected with the top electrode 213 of the first capacitor C11, and the top and bottom electrodes 215 and 213 of the second capacitor C12. Interconnections 219 are formed on the planarized surface of the inter-layer insulator 217, wherein the interconnections 219 are connected with the contact plugs 218. The interconnections 219 are electrically connected through the contact plugs 218 to the top electrode 213 of the first capacitor C11, and the top and bottom electrodes 215 and 213 of the second capacitor C12.

In the analogue circuit region 2000, the second capacitor C12 has the bottom electrode 213 of the conductive polysilicon and the top electrode 215 of tungsten silicide. In the DRAM region 1000, the first capacitor C11 has. the top and bottom electrodes 213 and 211, both of which are made of polysilicon. The above materials for the top and bottom electrodes 215 and 213 of the second capacitor C12 are effective to reduce the capacitance dependency upon applied voltage.

As described above, the second capacitor C12 is formed in the analogue circuit region 2000 after the first capacitor C11 is formed in the DRAM region 1000. Namely, the above described respective processes for forming the first and second capacitors C11 and C12 are partly common to each other but partly dedicated to the second capacitor C12. This means that a large number of the necessary steps are needed for forming both the first and second capacitors C11 and C12. Namely, after the first capacitor C11 has been completed in the DRAM region 1000, then the capacitive insulation film 214 and the top electrode 215 are formed by the additional steps for post-forming the second capacitor C12 in the analogue circuit region 2000.

In the analogue circuit region 2000, both the top and bottom electrodes 215 and 213 of the second capacitor C12 are electrically connected through the contact plugs 218 to the overlying interconnections 219. The second transistor TR12 is electrically connected through the interconnections 219 and the contact plugs 218 to the top and bottom electrodes 215 and 213 of the second capacitor C12, which is not completely illustrated in FIG. 1. A routing length of the interconnection which connects the second capacitor C12 and the second transistor TR12 is long. This causes a remarkable parasitic capacitance which provides a certain influence to the capacitance value of he second capacitor C12.

Furthermore, the contact plug 218 to the top electrode 215 of the second capacitor C12 in the analogue circuit region 2000 is formed in the same process or at the same time as the contact plug 218 to the top electrode 213 of the first capacitor C11 DRAM region 1000. For forming the contact plug 218 to the top electrode 215, it is necessary to realize a highly accurate control in etching the inter-layer-insulator 217 for the purpose of avoiding the contact plug 218 to penetrate the top electrode 215.

In order to have reduced the above-described problems, another conventional technique has been proposed, which is disclosed in Japanese laid-open patent publication No. 11-87639, wherein the first capacitor in the DRAM region and the second capacitor in the analogue circuit region or the logic circuit region are formed in the common processes. First and second transistors are formed in the DRAM region and the analogue circuit region. An inter-layer insulator is formed over the first and second transistors. In both the DRAM region and the analogue circuit region, bottom electrodes, dielectric films and top electrodes are laminated over the inter-layer insulator for forming both the first and second capacitors in the common processes. The first and second capacitors have a metal-insulator-metal (MIM) structure, wherein the top and bottom electrodes may comprise titanium nitride.

Since the first and second capacitors are formed in the common processes, a total number of the necessary steps for forming both the first and second capacitors is reduced. Further, the metal-insulator-metal (MIM) structure contributes to reduce the capacitance dependency upon applied voltage of the second capacitor in the analogue circuit region.

In the DRAM region, both the top and bottom electrodes of the first capacitor are electrically connected through contact plugs, which are formed in the underlying inter-layer insulator, to the first transistor on the silicon substrate.

In the analogue circuit region, both the top and bottom electrodes of the second capacitor are electrically connected through contact plugs, which are formed in the overlying inter-layer insulator, to the interconnections on the top surface of the overlying inter-layer insulator.

For each of the first and second capacitors in the DRAM region and the analogue circuit region, it is necessary that the top and bottom electrodes are displaced in a horizontal direction, so that the top and bottom electrodes do never overlap in the plan view. This makes it difficult to further reduce each occupied area in plan view or each horizontal size for each of the first and second capacitors in the DRAM region and the analogue circuit region.

In the analogue circuit region, the second capacitor is electrically connected through the overlying contact to the overlying interconnection which is further connected through another contact to the underlying transistor on the substrate. This structure has a large resistance of the electrical connections between the second capacitor and the transistor.

In the above circumstances, the development of a novel semiconductor device free from the above problems is desirable.

SUMMARY OF THE INVENTION

Accordingly, it is an object of the present invention to provide a novel semiconductor device free from the above problems.

It is a further object of the present invention to provide a novel semiconductor device having a digital circuit region including a first capacitor and an analogue circuit region including a second capacitor, wherein formations of the first and second capacitors need a reduced number of fabrication processes.

It is a still further object of the present invention to provide a novel semiconductor device having a digital circuit region including a first capacitor and an analogue circuit region including a second capacitor, wherein the second capacitor in the analogue circuit region has a reduced capacitance dependency upon applied voltage.

It is yet a further object of the present invention to provide a novel semiconductor device having a digital circuit region including a first capacitor and an analogue circuit region including a second capacitor, wherein each of the first and second capacitors have reduced horizontal sizes for realizing high density.

It is further more object of the present invention to provide a novel semiconductor device having a digital circuit region including a first capacitor and an analogue circuit region including a second capacitor, wherein the second capacitor in the analogue circuit region has an electrical connection with a reduced resistance to another element in the analogue circuit region.

It is another object of the present invention to provide a novel method of fabricating a semiconductor device free from the above problems.

It is further another object of the present invention to provide a novel method of fabricating a semiconductor device having a digital circuit region including a first capacitor and an analogue circuit region including a second capacitor, wherein formations of the first and second capacitors need a reduced number of fabrication processes.

It is still another object of the present invention to provide a novel method of fabricating a semiconductor device having a digital circuit region including a first capacitor and an analogue circuit region including a second capacitor, wherein the second capacitor in the analogue circuit region has a reduced capacitance dependency upon applied voltage.

It is yet another object of the present invention to provide a novel method of fabricating a semiconductor device having a digital circuit region including a first capacitor and an analogue circuit region including a second capacitor, wherein each of the first and second capacitors have reduced horizontal sizes for realizing high density.

It is an additional object of the present invention to provide a novel method of fabricating a semiconductor device having a digital circuit region including a first capacitor and an analogue circuit region including a second capacitor, wherein the second capacitor in the analogue circuit region has an electrical connection with a reduced resistance to another element in the analogue circuit region.

A semiconductor device includes: at least a digital circuit and at least an analogue circuit. The digital circuit further includes at least a first capacitive element of metal-insulator-metal structure, which further comprises a first bottom electrode layer, a first capacitive insulation layer and a first top electrode layer. The analogue circuit further includes at least a second capacitive element of metal-insulator-metal structure, which further comprises a second bottom electrode layer, a second capacitive insulation layer and a second top electrode layer. The first and second bottom electrode layers respectively comprise separated two parts derived from a first common metal layer. The first and second capacitive insulation layers respectively comprise separated two parts derived from a common insulation layer. The first and second top electrode layers respectively comprise separated two parts derived from a second common metal layer. The second bottom electrode of the second capacitor is electrically connected with at least a first contact in a first inter-layer insulator which underlies the second bottom electrode. The second top electrode of the second capacitor is electrically connected with at least a second contact in a second inter-layer insulator which overlies the second top electrode.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
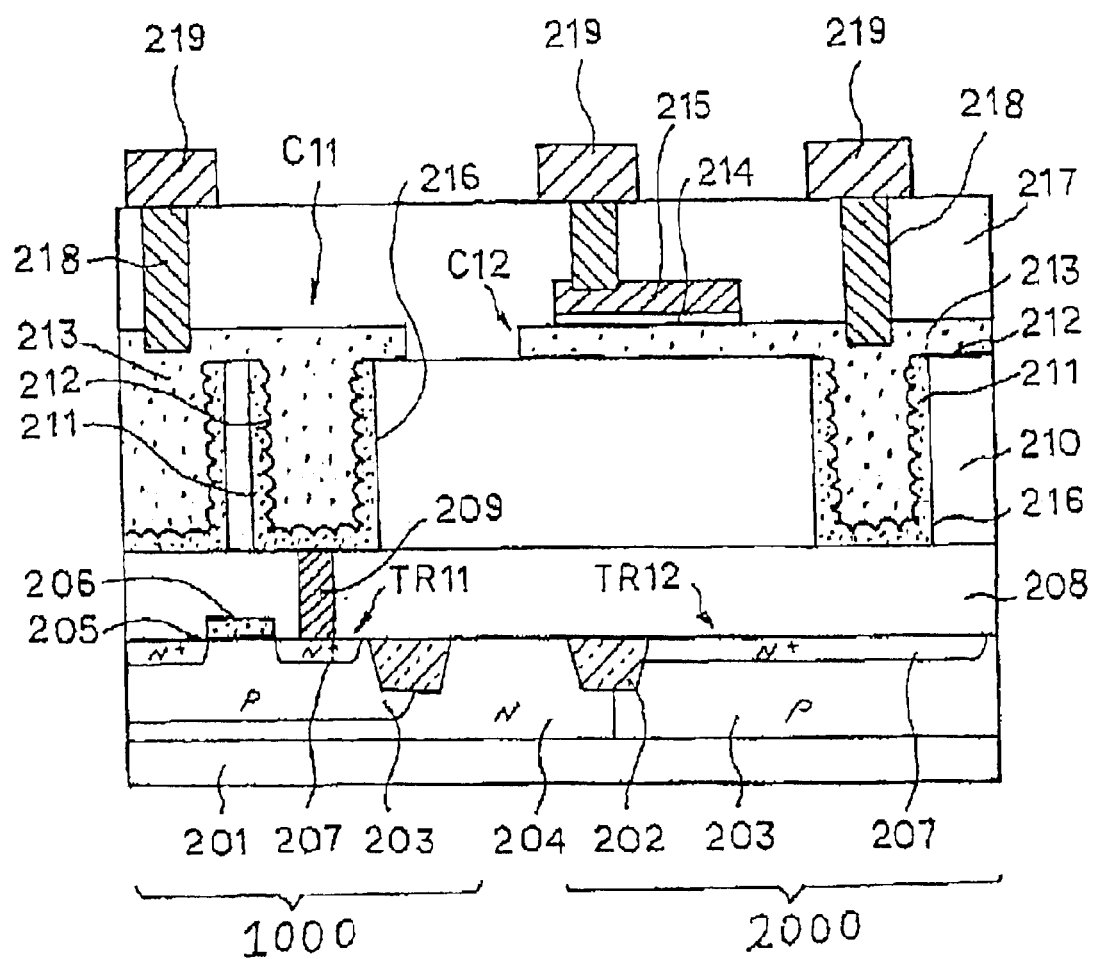
FIG. 1 is a fragmentary cross sectional elevation view illustrative of a conventional structure of a semiconductor device including a DRAM region and an analogue circuit region in the prior art.

A first aspect of the present invention is a semiconductor device including: at least a digital circuit including at least a first capacitive element of metal-insulator-metal structure, which further comprises a first bottom electrode layer, a first capacitive insulation layer and a first top electrode layer; and at least an analogue circuit including at least a second capacitive element of metal-insulator-metal structure, which further comprises a second bottom electrode layer, a second capacitive insulation layer and a second top electrode layer, wherein the first and second bottom electrode layers respectively comprise separated two parts derived from a first common metal layer, wherein the first and second capacitive insulation layers respectively comprise separated two parts derived from a common insulation layer, wherein the first and second top electrode layers respectively comprise separated two parts derived from a second common metal layer, wherein the second bottom electrode of the second capacitor is electrically connected with at least a first contact in a first inter-layer insulator which underlies the second bottom electrode, and wherein the second top electrode of the second capacitor is electrically connected with at least a second contact in a second inter-layer insulator which overlies the second top electrode.

It is possible that the first capacitive element comprises a three-dimensional-structured capacitor, and the second capacitive element comprises a planar-structured capacitor.

It is also possible that the three-dimensional-structured capacitor is provided in a groove formed in the first inter-layer insulator.

It is also possible that the three-dimensional-structured capacitor comprises a cylinder-shaped capacitor provided in a cylinder-shaped groove formed in the first inter-layer insulator.

It is also possible that the first and second bottom electrode layers are identical with each other in material and thickness, wherein the first and second capacitive insulation layers are identical with each other in material and thickness, and wherein the first and second top electrode layers are identical with each other in material and thickness.

It is also possible that the second bottom electrode of the second capacitor is electrically connected with a plurality of the second contact in the first inter-layer insulator.

It is also possible that the second bottom electrode is electrically connected with the first contact to a second transistor on a substrate, over which the first inter-layer insulator extends, and the second top electrode is electrically connected with the second contact to a second interconnection extending over a surface of the second inter-layer insulator.

It is also possible that the first bottom electrode of the first capacitor is electrically connected with at least a third contact in the first inter-layer insulator, and the first top electrode of the first capacitor is electrically connected with at least a fourth contact in the second inter-layer insulator.

It is also possible that the first bottom electrode is electrically connected with the third contact to a first transistor on a substrate, over which the first inter-layer insulator extends, and the first top electrode is electrically connected with the fourth contact to a first interconnection extending over a surface of the second inter-layer insulator.

It is also possible that the digital circuit includes DRAM cells.

A second aspect of the present invention is a semiconductor device including: a semiconductor substrate which includes a digital circuit region and an analogue circuit region; a first transistor provided on the semiconductor substrate and in the digital circuit region; a second transistor provided on the semiconductor substrate and in the analogue circuit region; a first inter-layer insulator overlying the first and second transistors and the semiconductor substrate, and the first inter-layer insulator including a lower half part and an upper half part; a groove formed in the upper half part of the first inter-layer insulator over the digital circuit region of the semiconductor substrate; a first capacitive element of a metal-insulator-metal three-dimensional structure in the groove, and the first capacitive element further comprising a first bottom electrode layer, a first capacitive insulation layer and a first top electrode layer; a first contact formed in the lower half part of the first inter-layer insulator for providing a first electrical connection between the first bottom electrode layer and the first transistor; a second capacitive element of a metal-insulator-metal planer structure over the first inter-layer insulator, and the second capacitive element further comprising a second bottom electrode layer, a second capacitive insulation layer and a second top electrode layer; at least a second contact formed in the lower and upper half parts of the first inter-layer insulator for providing a second electrical connection between the second bottom electrode layer and the second transistor; a second inter-layer insulator overlying the first and second capacitive elements and the first inter-layer insulator; first and second interconnections extending over the second inter-layer insulator; a third contact formed in the second inter-layer insulator for providing a third electrical connection between the first top electrode and the first interconnection; and a fourth contact formed in the second inter-layer insulator for providing a fourth electrical connection between the second top electrode and the second interconnection, wherein the first and second bottom electrode layers respectively comprise separated two parts derived from a first common metal layer, wherein the first and second capacitive insulation layers respectively comprise separated two parts derived from a common insulation layer, wherein the first and second top electrode layers respectively comprise separated two parts derived from a second common metal layer.

It is also possible that the first capacitor comprises a cylinder-shaped capacitor provided in a cylinder-shaped groove formed in the upper half part of first inter-layer insulator.

It is also possible that the first and second bottom electrode layers are identical with each other in material and thickness, wherein the first and second capacitive insulation layers are identical with each other in material and thickness, and wherein the first and second top electrode layers are identical with each other in material and thickness.

It is also possible that the second bottom electrode of the second capacitor is electrically connected with a plurality of the second contact in the first inter-layer insulator.

It is also possible that the digital circuit includes DRAM cells.

A third aspect of the present invention is a method of forming a semiconductor device, comprising the steps of: defining a digital circuit region and an analogue circuit region in a semiconductor substrate; forming first and second semiconductor elements on the digital circuit region and on the analogue circuit region of the semiconductor substrate, respectively; forming a first inter-layer insulator overlying the first and second semiconductor elements and the semiconductor substrate, and the first inter-layer insulator including a lower half part and an upper half part; forming a groove in the upper half part of the first inter-layer insulator over the digital circuit region of the semiconductor substrate; forming a first contact in the lower half part of the first inter-layer insulator, and at least a second contact in the lower and upper half parts of the first inter-layer insulator; forming a common bottom electrode metal layer over the first inter-layer insulator and within the groove, and the common bottom electrode metal layer being electrically connected through the first and second contacts to the first and second semiconductor elements, respectively; forming a common capacitive insulation layer on the common bottom electrode metal layer; forming a common top electrode metal layer on the common capacitive insulation layer to form a lamination structure which comprises the common bottom electrode metal layer, the common capacitive insulation layer, and the common top electrode metal layer; patterning the lamination structure, thereby to form concurrently both a first capacitive element of a metal-insulator-metal three-dimensional structure in the groove, and a second capacitive element of a metal-insulator-metal planer structure over the first inter-layer insulator; forming a second inter-layer insulator overlying the first and second capacitive elements and the first inter-layer insulator; forming third and fourth contacts in the second inter-layer insulator; and forming first and second interconnections extending over the second inter-layer insulator, and the first and second interconnections being electrically connected through the third and fourth contacts to the first and second capacitive elements, respectively.

It is also possible that the first capacitor comprises a cylinder-shaped capacitor provided in a cylinder-shaped groove formed in the upper half part of first inter-layer insulator.

It is also possible that the first and second bottom electrode layers are identical with each other in material and thickness, wherein the first and second capacitive insulation layers are identical with each other in material and thickness, and wherein the first and second top electrode layers are identical with each other in material and thickness.

It is also possible that the second capacitor is electrically connected with a plurality of the second contact in the first inter-layer insulator.

It is also possible that the digital circuit region includes DRAM cells.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

First Embodiment

Figure 2:
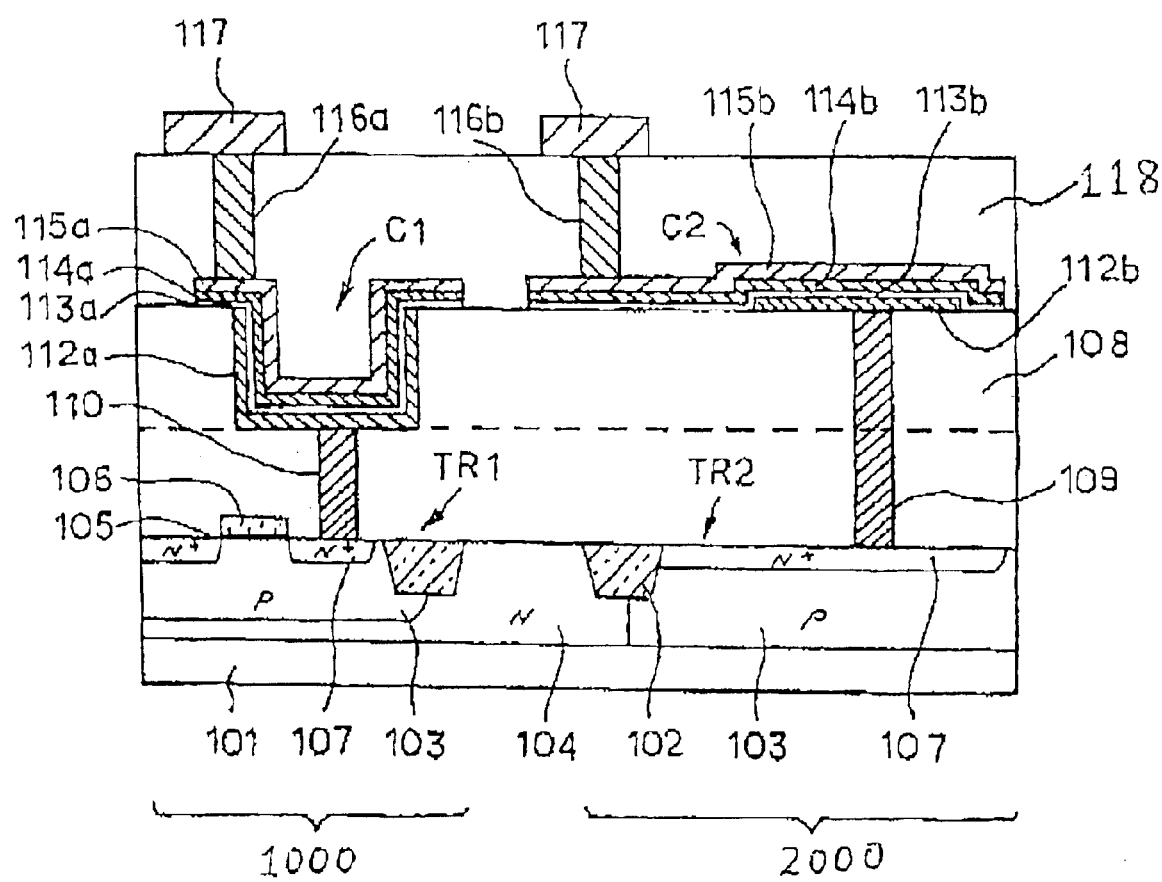
FIG. 2 is a fragmentary cross sectional elevation view illustrative of a novel structure of a semiconductor device including a DRAM region and an analogue circuit region in a first embodiment in accordance with the present invention.

A first embodiment according to the present invention will be described in detail with reference to the drawings. FIG. 2 is a fragmentary cross sectional elevation view illustrative of a novel structure of a semiconductor device including a DRAM region and an analogue circuit region in a first embodiment in accordance with the present invention. The semiconductor device includes a DRAM region 1000 and an analogue circuit region 2000 over a silicon substrate 101. The DRAM region 1000 includes a DRAM cell and its peripheral circuits.

Over the silicon substrate 101, p-well regions 103 and n-well region 104 are selectively provided, so that the p-well regions 103 are isolated from each other by shallow trench isolations 102. The p-well regions 103 are included in the DRAM region 1000 and the analogue circuit region 2000, respectively. The p-well regions 103 are isolated from each other by the n-well region 104.

Over the p-well regions 103 in the DRAM region 1000 and the analogue circuit region 2000, a gate insulation film 105 is provided. Gate electrodes 106 are provided on the gate insulation film 105. Source and drain regions 107 are selectively provided in upper regions of the p-well regions 103 in the DRAM region 1000 and the analogue circuit region 2000, whereby first and second transistors TR1 and TR2 are provided in the DRAM region 1000 and the analogue circuit region 2000, respectively.

A first inter-layer insulator 108 with a planarized surface is provided over the p-well regions 103 and the n-well region 104, so that the first inter-layer insulator 108 overlies the first and second transistors TR1 and TR2.

In the DRAM region 1000, a first capacitor C1 is provided in a cylinder-shaped hole in the first inter-layer insulator 108. The first capacitor C1 is electrically connected through a first contact 110 to the first transistor TR1, wherein the first contact 110 is formed in the first inter-layer insulator 108. The first capacitor C1 has a cylinder-shape. The first capacitor C1 has a metal-insulator-metal structure (MIM-structure). The first capacitor C1 comprises laminations of a bottom electrode 112a, a capacitive insulation film 113a, and a top electrode having a double-layered structure comprising a first top electrode layer 114a and a second top electrode layer 115a overlying the first top electrode layer 114a. The bottom electrode 112a of the first capacitor C1 is electrically connected to the first transistor TR1 through the contact 110 which is provided in the first inter-layer insulator 108.

In the analogue circuit region 2000, a second capacitor C2 is provided on the planarized surface of the first inter-layer insulator 108. The second capacitor C2 is electrically connected through a second contact 109 to the first transistor TR1, wherein the second contact 109 is formed in the first inter-layer insulator 108. The second capacitor C2 has a planar-shape. The second capacitor C2 also has a metal-insulator-metal structure (MIM-structure). The second capacitor C2 comprises laminations of a bottom electrode 112b, a capacitive insulation film 113b, and a top electrode having a double-layered structure comprising a first top electrode layer 114b and a second top electrode layer 115b overlying the first top electrode layer 114b. The bottom electrode 112b of the second capacitor C2 is electrically connected to the second transistor TR2 through the contact 110 which is provided in the first inter-layer insulator 108.

A second inter-layer insulator 118 with a planarized surface is provided over the first and second capacitors C1 and C2 and over the first inter-layer insulator 108. The top electrode comprising the first and second top electrode layers 114a and 115a of the first capacitor C1 is electrically connected through a contact plug 116a to an interconnection 117, wherein the contact plug 116a is formed in the second inter-layer insulator 118, and the interconnection 117 extends over the planarized surface of the second inter-layer insulator 118. The top electrode comprising the first and second top electrode layers 114b and 115b of the second capacitor C2 is electrically connected through a contact plug 116b to another interconnection 117, wherein the contact plug 116b is formed in the second inter-layer insulator 118, and the other interconnection 117 extends over the planarized surface of the second inter-layer insulator 118.

FIGS. 3A through 3G are fragmentary cross sectional elevation views illustrative of a novel method of fabricating the novel structure of the semiconductor device shown in FIG. 2 in the first embodiment in accordance with the present invention.

Figure 3A:
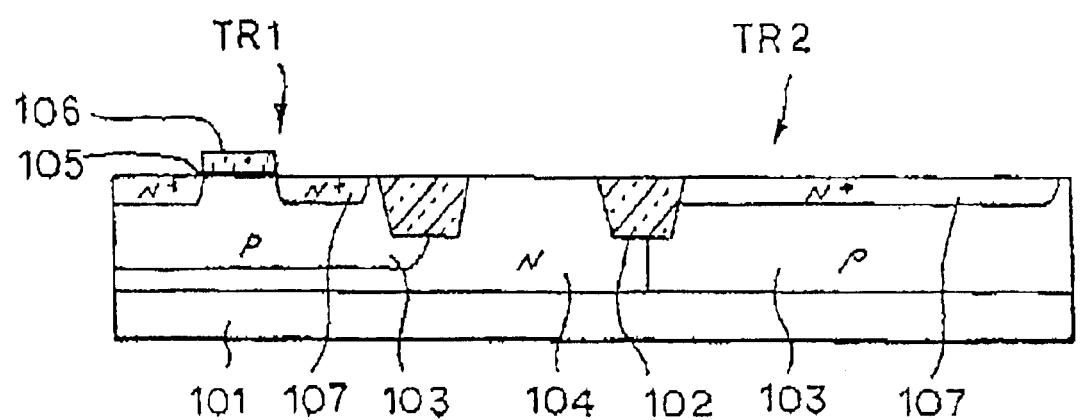
FIGS. 3A through 3G are fragmentary cross sectional elevation views illustrative of a novel method of fabricating the novel structure of the semiconductor device shown in FIG. 2 in the first embodiment in accordance with the present invention.

With reference to FIG. 3A, shallow trenches are selectively formed in upper regions of a p-type silicon substrate 101. Insulation films are filled into the shallow trenches to form shallow trench isolations 102 in the upper regions of the p-type silicon substrate 101, whereby a DRAM region 1000 and an analogue circuit region 2000 are defined by the shallow trench isolations 102 respectively, as well as respective first and second transistor regions are thus defined thereby.

Over the silicon substrate 101, p-well regions 103 and n-well region 104 are selectively formed by selective ion-implantation processes, so that the p-well regions 103 are isolated from each other by shallow trench isolations 102. The p-well regions 103 are included in the DRAM region 1000 and the analogue circuit region 2000, respectively. The p-well regions 103 are isolated from each other by the n-well region 104.

Over the p-well regions 103 in the DRAM region 1000 and the analogue circuit region 2000, a gate insulation film 105 of silicon oxide having a thickness of 7 nanometers is formed. An impurity-doped polysilicon film having a thickness of 150 nanometers is deposited over the gate insulation film 105. The impurity-doped polysilicon film is patterned by a lithography technique and an anisotropic etching process, thereby to form gate electrodes 106 on the gate insulation film 105. A selective ion-implantation into the p-well regions 103 in the DRAM region 1000 and the analogue circuit region 2000 and a subsequent heat treatment are carried out for forming source and drain regions 107 of impurity diffusion regions in upper regions of the p-well regions 103 in the DRAM region 1000 and the analogue circuit region 2000, whereby first and second transistors TR1 and TR2 are formed in the DRAM region 1000 and the analogue circuit region 2000, respectively.

Figure 3B:
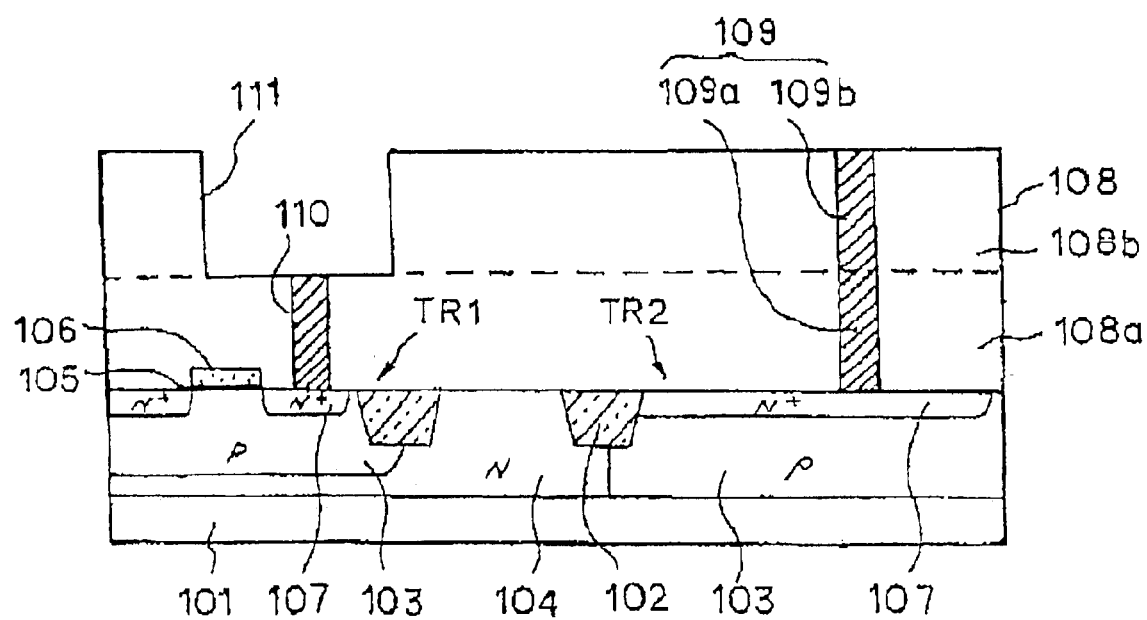

With reference to FIG. 3B, a BPSG film 108a containing few percents of boron and phosphorous and having a thickness of 500 nanometers is then deposited by a chemical vapor deposition. A surface of the deposited BPSG film 108a is then polished at about 200 nanometers in depth by a chemical mechanical polishing method, in order to obtain a planarized surface of the BPSG film 108a. Contact holes are formed in the BPSG film 108a by a lithography technique and an anisotropic etching process, so that the contact holes communicate with parts of the source and drain regions 107 and gate electrodes 106 of the first and second transistors TR1 and TR2. A titanium nitride (TiN) film having a thickens of 10 nanometers and a blanket tungsten (W) film having a thickens of 400 nanometers are sequentially deposited to fill the contact holes. An etch-back process or a polishing process is carried out to leave the titanium nitride (TiN) film and the blanket tungsten (W) film only within the contact holes, whereby contact plugs 110 and 109a are formed in the BPSG film 108a.

A further BPSG film 108b having a thickness of 800 nanometers is deposited over the BPSG film 108a. A surface of the deposited BPSG film 108b is then polished at about 300 nanometers in depth to obtain a planarized surface of the BPSG film 108b, whereby a first inter-layer insulator 108 is formed, which comprises the BPSG film 108a and the BPSG film 108b.

A further contact hole is formed in the BPSG film 108b but in the analogue circuit region 2000, so that the further contact hole is positioned directly over the contact plug 109a in the BPSG film 108a. A tungsten film is deposited to fill the further contact hole. An etch-back process is carried out to the deposited tungsten film, so that the tungsten film remains only within the further contact hole, whereby a contact plug 109b is formed in the BPSG film 108b, wherein the contact plug 109b is positioned directly over the contact plug 109a. The contact plug 109b has the same diameter as the contact plug 109a. The contact plug 109b is also just aligned to the contact plug 109a. As a result, a contact plug 109, comprising the contact plugs 109a and 109b united with each other, is formed in the first inter-layer insulator 108, comprising the BPSG films 108a and 108b in the analogue circuit region 2000.

In the DRAM region 1000, a cylinder-shaped large hole 111 is formed in the BPSG film 108b by a lithography technique and an anisotropic etching process by about 300 nanometers in depth, so that a top of the contact plug 110 is exposed through the cylinder-shaped large hole 111. As a result, the cylinder-shaped large hole 111 is positioned directly over the contact plug 110, wherein the cylinder-shaped large hole 111 is larger in diameter than the contact plug 110.

Figure 3C:
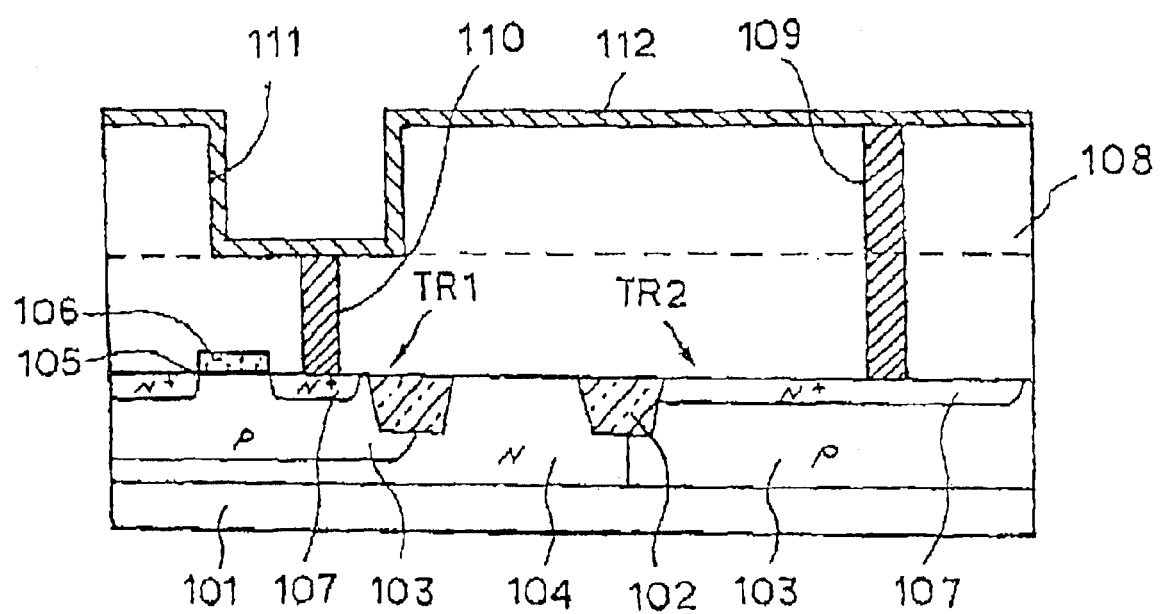

With reference to FIG. 3C, a titanium nitride film 112 having a thickness of 30 nanometers is deposited on the planarized surface of the first inter-layer insulator 108 and also on a side wall and a bottom of the cylinder-shaped large hole 111.

Figure 3D:
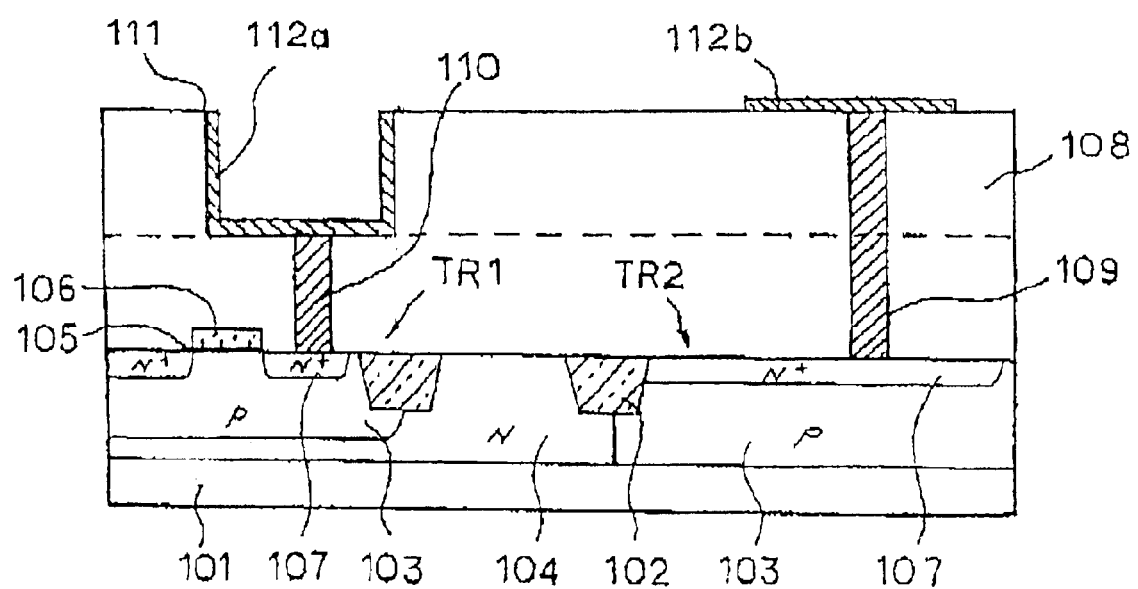

With reference to FIG. 3D, a lithography technique and an etching process are carried out to selectively remove the titanium nitride film 112, so that the titanium nitride film 112 remains only on the side wall and a bottom of the cylinder-shaped large hole 111 as well as on a predetermined area of the planarized surface of the first inter-layer insulator 108, whereby a bottom electrode 112a of a cylinder shape is formed within the cylinder-shaped large hole 111, while another bottom electrode 112b of a planer shape is formed on the planarized surface of the first inter-layer insulator 108. The bottom electrode 112a is thus connected through the contact plug 110 to the first transistor TR1 in the DRAM region 1000. The bottom electrode 112b is connected through the contact plug 109 to the second transistor TR2.

Figure 3E:
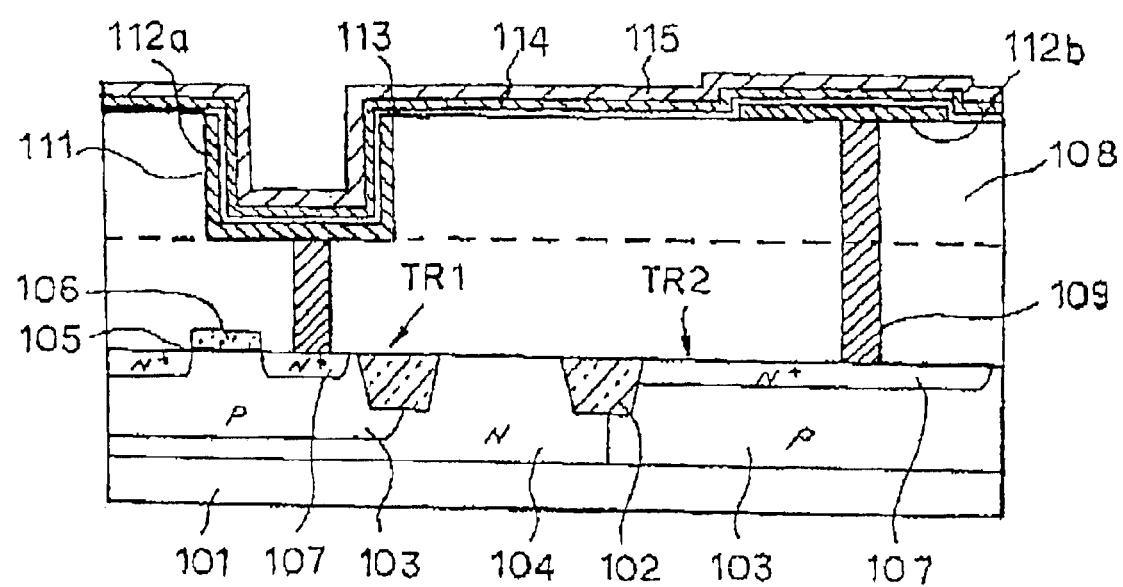

With reference to FIG. 3E, a tantalum oxide film ($Ta_2O_5$) 113 as a capacitive insulation film having a thickness of 16 nanometers is deposited on the top electrodes 112a and 112b and also on the planarized surface of the first inter-layer insulator 108. An titanium nitride film 114 as a lower layer of a double layered top electrode and having a thickness of 30 nanometers is deposited on the tantalum oxide film ($Ta_2O_5$) 113. A tungsten film 115 as a higher layer of a double layered top electrode and having a thickness of 10 nanometers is deposited on the titanium nitride film 114.

Figure 3F:
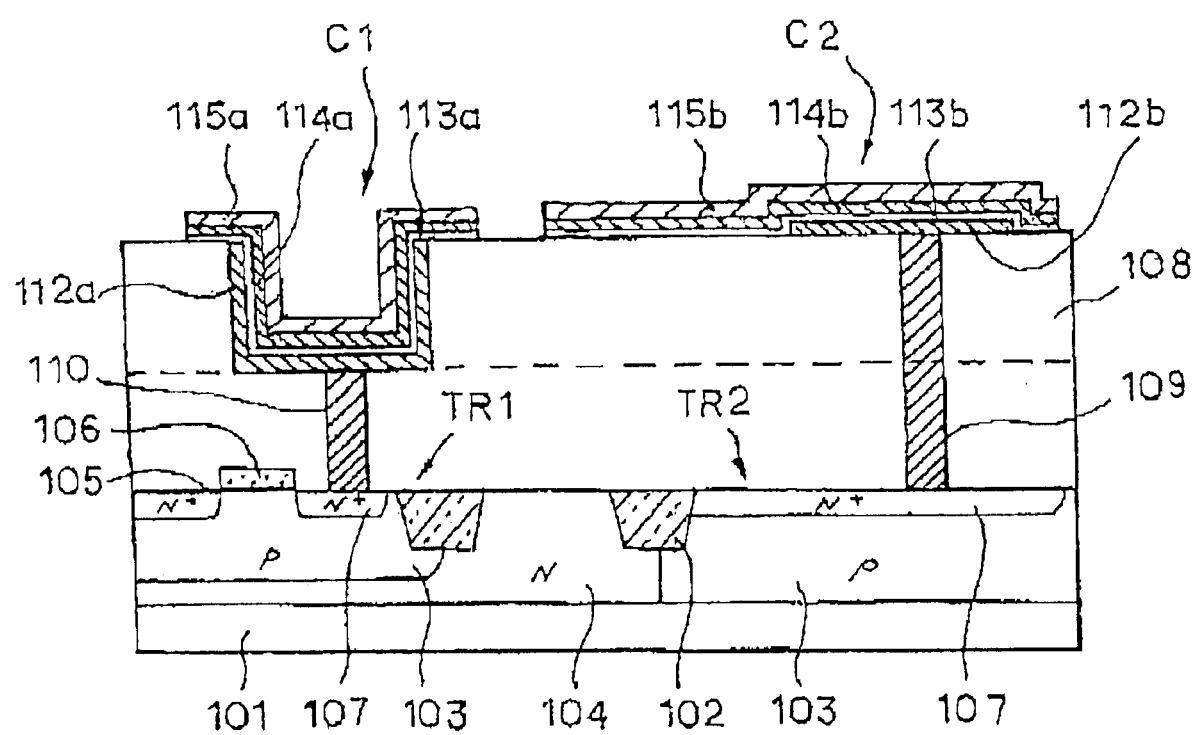

With reference to FIG. 3F, a lithography technique and an etching process are carried out for patterning a lamination structure comprising the tantalum oxide film ($Ta_2O_5$) 113, the titanium nitride film 114 and the tungsten film 115, so that a capacitive insulation film 113a and a top electrode of a double layered structure of the titanium nitride film 114a and the tungsten film 115a are defined, thereby forming a first capacitor C1 of a cylinder shape in the cylinder-shaped large hole 111 in the DRAM region 1000. Further, another capacitive insulation film 113b and another top electrode of the double layered structure of the titanium nitride film 114b and the tungsten film 115b are defined, thereby forming a second capacitor C2 of a planer shape over the first inter-layer insulator 108 in the analogue circuit region 2000.

Figure 3G:
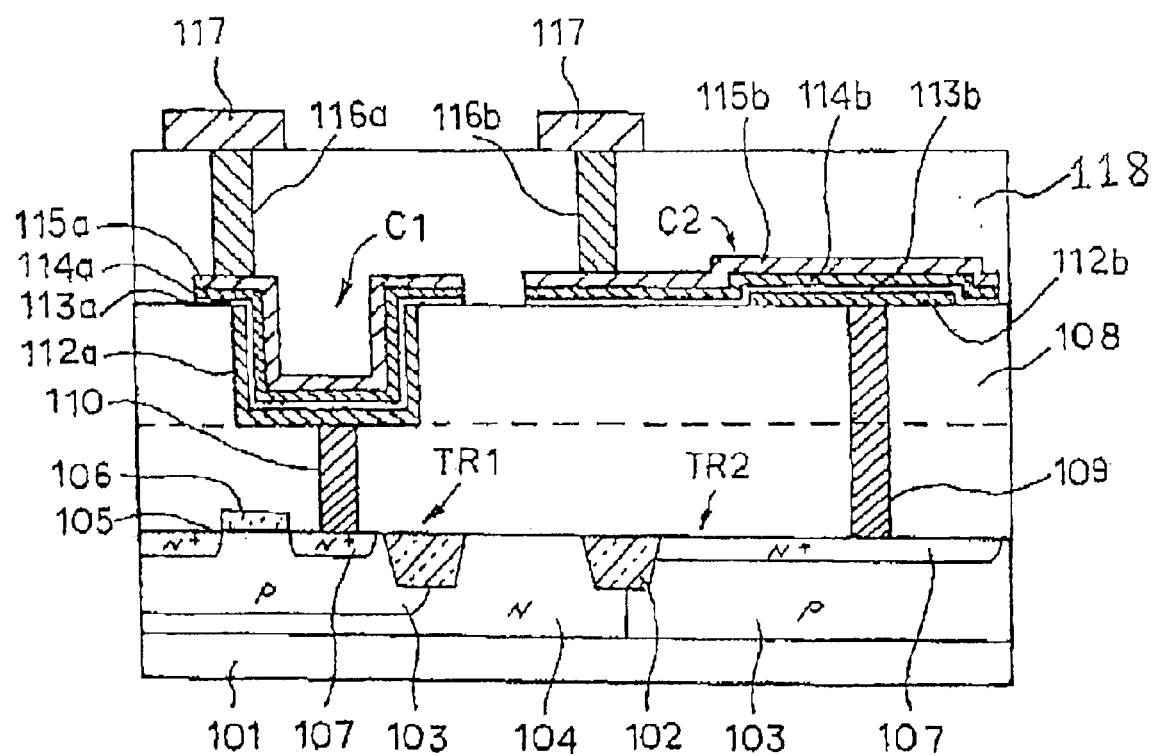

With reference to FIG. 3G, a second inter-layer insulator 118 is deposited over the first and second capacitors C1 and C2 and also over the planarized surface of the first inter-layer insulator 108. A surface of the second inter-layer insulator 118 is also planarized by a chemical mechanical polishing method. Contact holes are formed in the second inter-layer insulator 118, wherein the contact holes are positioned directly over parts of the top electrodes of the first and second capacitors C1 and C2. The contact holes are then filled with tungsten to form contact plugs 116a and 116b which communicate with the top electrodes of the first and second capacitors C1 and C2. Interconnections 117 are formed on the planarized surface of the second inter-layer insulator 118, wherein the interconnections 117 are in contact with the tops of the contact plugs 116a and 166b, so that the interconnections 117 are connected through the contact plugs 116a and 166b to the top electrodes of the first and second capacitors C1 and C2.

As described above, the first and second capacitors C1 and C2 are formed in the same or common processes in the DRAM region 1000 and the analogue circuit region 2000, respectively, thereby to reduce the number of the necessary processes for forming both the first and second capacitors C1 and C2.

Both the first and second capacitors C1 and C2 have the metal-insulator-metal structure in order to reduce respective capacitance dependencies upon applied voltage. The second capacitor C2 is suitable as a capacitive element in the analogue circuit region 2000.

The bottom electrodes 112a and 112b of the first and second capacitors C1 and C2 are electrically connected through the contact plugs 110 and 109 in the first inter-layer insulator 108 to the first and second transistors TR1 and TR2 on the substrate 101, respectively. The top electrodes 115a and 115b of the first and second capacitors C1 and C2 are electrically connected through the contact plugs 116a and 116b in the second inter-layer insulator 118 to the interconnections 117 over the second inter-layer insulator 118. This allows a reduction or minimization in the overlapping area between the top and bottom electrodes of each of the first and second capacitors C1 and C2. This allows a horizontal size reduction of each of the first and second capacitors C1 and C2. This further allows minimization in length of the electrical connections between the top electrodes of the first and second capacitors C1 and C2 to the interconnections 117 and also the other electrical connections between the bottom electrodes of the first and second capacitors C1 and C2 to the first and second transistors TR1 and TR2. The minimization in length of the electrical connections reduces the resistances of the electrical connections, and further reduces the parasitic capacitance of the electrical connections. Namely, this reduces the influence to the capacitance value of each of the first and second capacitors C1 and C2.

Further, the contact plugs 116a and 116b in the DRAM region 1000 and the analogue circuit region 2000 have the same depth, for which reason it is easy to avoid that the contact plugs 116a and 116b penetrate the top electrodes 115a and 155b of the first and second capacitors C1 and C2.

Second Embodiment

Figure 4:
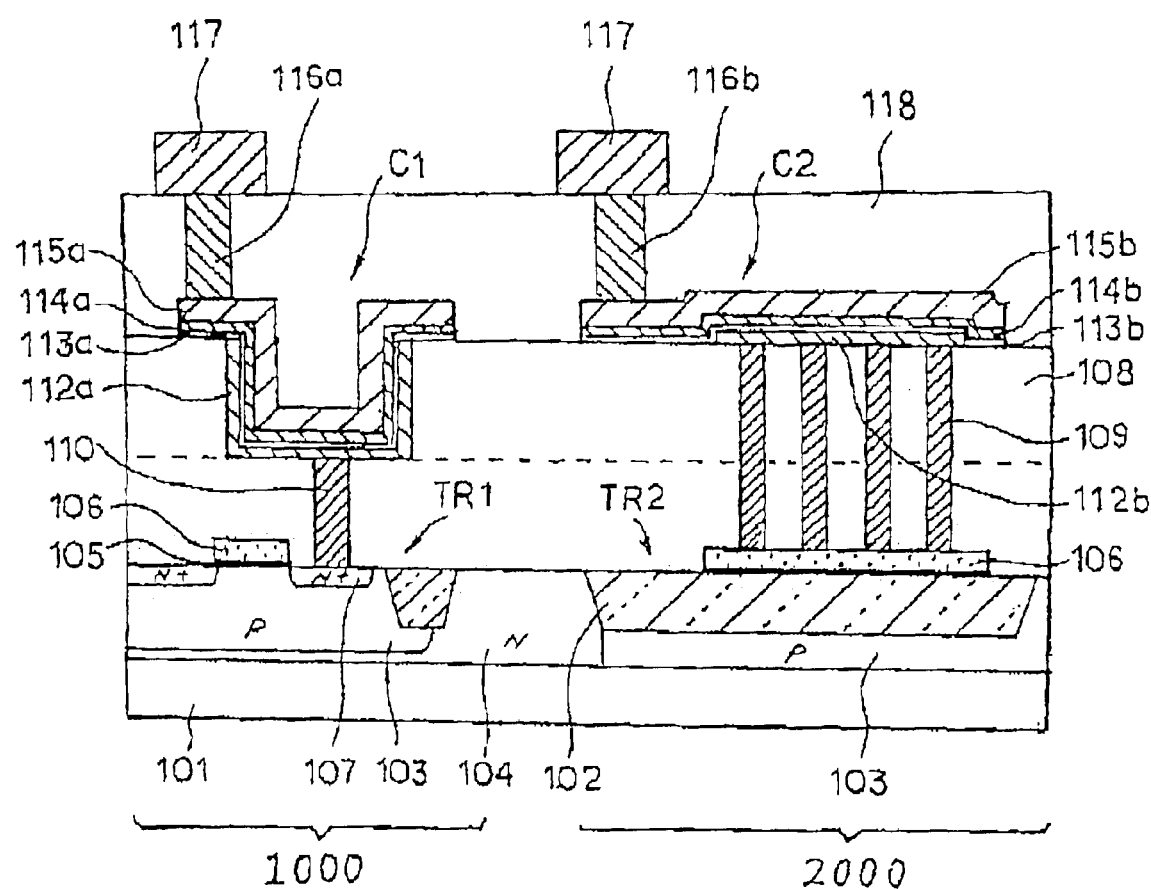
FIG. 4 is a fragmentary cross sectional elevation view illustrative of a novel structure of a semiconductor device including a DRAM region and an analogue circuit region in a second embodiment in accordance with the present invention.

A second embodiment according to the present invention will be described in detail with reference to the drawings. FIG. 4 is a fragmentary cross sectional elevation view illustrative of a novel structure of a semiconductor device including a DRAM region and an analogue circuit region in a second embodiment in accordance with the present invention. The semiconductor device includes a DRAM region 1000 and an analogue circuit region 2000 over a silicon substrate 101. The DRAM region 1000 includes a DRAM cell and its peripheral circuits.

Over the silicon substrate 101, p-well regions 103 and n-well region 104 are selectively provided. The p-well regions 103 are included in the DRAM region 1000 and the analogue circuit region 2000, respectively. The p-well regions 103 are isolated from each other by the n-well region 104. Shallow trench isolations 102 are provided on boundaries between the p-well regions 103 and the n-well region 104. In the analogue circuit region 2000, the shallow trench isolation 102 is provided over the p-well region 103.

Over the p-well regions 103 in the DRAM region 1000 and over the shallow trench isolation 102 in the analogue circuit region 2000, a gate insulation film 105 is provided. Gate electrodes 106 are provided on the gate insulation film 105, so that the gate electrodes 106 are positioned over the p-well regions 103 in the DRAM region 1000 and over the shallow trench isolation 102 in the analogue circuit region 2000. Source and drain regions 107 are selectively provided in upper regions of the p-well regions 103 in the DRAM region 1000 and the analogue circuit region 2000, whereby first and second transistors TR1 and TR2 are provided in the DRAM region 1000 and the analogue circuit region 2000, respectively.

A first inter-layer insulator 108 with a planarized surface is provided over the p-well regions 103 and the n-well region 104, so that the first inter-layer insulator 108 overlies the first and second transistors TR1 and TR2.

In the DRAM region 1000, a first capacitor C1 is provided in a cylinder-shaped hole in the first inter-layer insulator 108. The first capacitor C1 is electrically connected through a first contact 110 to the first transistor TR1, wherein the first contact 110 is formed in the first inter-layer insulator 108. The first capacitor C1 has a cylinder-shape. The first capacitor C1 has a metal-insulator-metal structure (MIM-structure). The first capacitor C1 comprises laminations of a bottom electrode 112a, a capacitive insulation film 113a, and a top electrode having a double-layered structure comprising a first top electrode layer 114a and a second top electrode layer 115a overlying the first top electrode layer 114a. The bottom electrode 112a of the first capacitor C1 is electrically connected to the first transistor TR1 through the contact 110 which is provided in the first inter-layer insulator 108.

In the analogue circuit region 2000, a second capacitor C2 is provided on the planarized surface of the first inter-layer insulator 108. The second capacitor C2 is electrically connected through a plurality of second contacts 109 to the first transistor TR1, wherein the plurality of second contacts 109 are formed in the first inter-layer insulator 108. The second capacitor C2 has a planar-shape. The second capacitor C2 also has a metal-insulator-metal structure (MIM-structure). The second capacitor C2 comprises laminations of a bottom electrode 112b, a capacitive insulation film 113b, and a top electrode having a double-layered structure comprising a first top electrode layer 114b and a second top electrode layer 115b overlying the first top electrode layer 114b. The bottom electrode 112b of the second capacitor C2 is electrically connected to the second transistor TR2 through the contact 110 which is provided in the first inter-layer insulator 108.

A second inter-layer insulator 118 with a planarized surface is provided over the first and second capacitors C1 and C2 and over the first inter-layer insulator 108. The top electrode comprising the first and second top electrode layers 114a and 115a of the first capacitor C1 is electrically connected through a contact plug 116a to an interconnection 117, wherein the contact plug 116a is formed in the second inter-layer insulator 118, and the interconnection 117 extends over the planarized surface of the second inter-layer insulator 118. The top electrode comprising the first and second top electrode layers 114b and 115b of the second capacitor C2 is electrically connected through a contact plug 116b to another interconnection 117, wherein the contact plug 116b is formed in the second inter-layer insulator 118, and the other interconnection 117 extends over the planarized surface of the second inter-layer insulator 118.

FIGS. 5A through 5E are fragmentary cross sectional elevation views illustrative of a novel method of fabricating the novel structure of the semiconductor device shown in FIG. 4 in the second embodiment in accordance with the present invention.

Figure 5A:
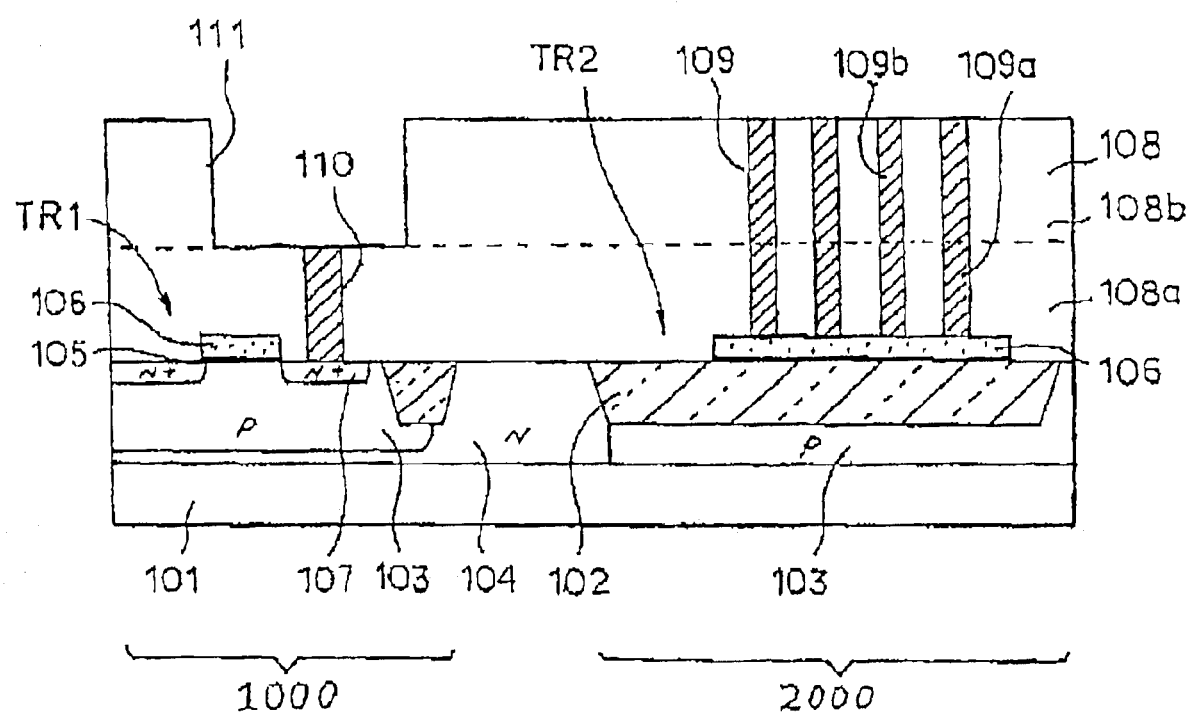
FIGS. 5A through 5E are fragmentary cross sectional elevation views illustrative of a novel method of fabricating the novel structure of the semiconductor device shown in FIG. 4 in the second embodiment in accordance with the present invention.

With reference to FIG. 5A, shallow trenches are selectively formed in upper regions of a p-type silicon substrate 101. Insulation films are filled into the shallow trenches to form shallow trench isolations 102 in the upper regions of the p-type silicon substrate 101, whereby a DRAM region 1000 and an analogue circuit region 2000 are defined by the shallow trench isolations 102 respectively, as well as respective first and second transistor regions are thus defined thereby.

Over the silicon substrate 101, p-well regions 103 and n-well region 104 are selectively formed by selective ion-implantation processes, so that the p-well regions 103 are isolated from each other by shallow trench isolations 102. The p-well regions 103 are included in the DRAM region 1000 and the analogue circuit region 2000, respectively. The p-well regions 103 are isolated from each other by the n-well region 104.

Over the p-well regions 103 in the DRAM region 1000 and the analogue circuit region 2000, a gate insulation film 105 of silicon oxide having a thickness of 7 nanometers is formed. An impurity-doped polysilicon film having a thickness of 150 nanometers is deposited over the gate insulation film 105. The impurity-doped polysilicon film is patterned by a lithography technique and an anisotropic etching process, thereby to form gate electrodes 106 on the gate insulation film 105. A selective ion-implantation into the p-well regions 103 in the DRAM region 1000 and the analogue circuit region 2000 and a subsequent heat treatment are carried out for forming source and drain regions 107 of impurity diffusion regions in upper regions of the p-well regions 103 in the DRAM region 1000 and the analogue circuit region 2000, whereby first and second transistors TR1 and TR2 are formed in the DRAM region 1000 and the analogue circuit region 2000, respectively.

A BPSG film 108a containing few percents of boron and phosphorous and having a thickness of 500 nanometers is then deposited by a chemical vapor deposition. A surface of the deposited BPSG film 108a is then polished at about 200 nanometers in depth by a chemical mechanical polishing method, in order to obtain a planarized surface of the BPSG film 108a. Contact holes are formed in the BPSG film 108a by a lithography technique and an anisotropic etching process, so that the contact holes communicate with parts of the source and drain regions 107 and gate electrodes 106 of the first and second transistors TR1 and TR2. In the DRAM region, the single contact hole is formed in the BPSG film 108a. In the analogue circuit region 2000, a plurality of contact holes are formed in the BPSG film 108a.

A titanium nitride (TiN) film having a thickens of 10 nanometers and a blanket tungsten (W) film having a thickens of 400 nanometers are sequentially deposited to fill the contact holes. An etch-back process or a polishing process is carried out to leave the titanium nitride (TiN) film and the blanket tungsten (W) film only within the contact holes, whereby a single contact plug 110 is formed in the BPSG film 108a in the DRAM region 1000, while a plurality of contact plugs 109a are formed in the BPSG film 108a in the analogue circuit region 2000. The plurality of contact plugs 109a are in contact with the gate electrode 106 of the second transistor TR2 in the analogue circuit region 2000.

A further BPSG film 108b having a thickness of 800 nanometers is deposited over the BPSG film 108a. A surface of the deposited BPSG film 108b is then polished at about 300 nanometers in depth to obtain a planarized surface of the BPSG film 108b, whereby a first inter-layer insulator 108 is formed, which comprises the BPSG film 108a and the BPSG film 108b.

A plurality of further contact holes are formed in the BPSG film 108b but in the analogue circuit region 2000, so that the further plural contact holes are positioned directly over the above plural contact plugs 109a in the BPSG film 108a. A tungsten film is deposited to fill the further plural contact holes. An etch-back process is carried out to the deposited tungsten film, so that the tungsten film remains only within the further plural contact holes, whereby a plurality of contact plugs 109b are formed in the BPSG film 108b in the analogue circuit region 2000, wherein each of the plurality of contact plugs 109b are positioned directly over each of the plurality of contact plugs 109a. Each of the plural contact plugs 109b has the same diameter as each of the plural contact plugs 109a. Each of the plural contact plugs 109b is also just aligned to each of the plural contact plugs 109a. As a result, a plurality of contact plugs 109, each comprising the contact plugs 109a and 109b united with each other, are formed in the first inter-layer insulator 108, comprising the BPSG films 108a and 108b in the analogue circuit region 2000.

In the DRAM region 1000, a cylinder-shaped large hole 111 is formed in the BPSG film 108b by a lithography technique and an anisotropic etching process by about 300 nanometers in depth, so that a top of the contact plug 110 is exposed through the cylinder-shaped large hole 111. As a result, the cylinder-shaped large hole 111 is positioned directly over the contact plug 110, wherein the cylinder-shaped large hole 111 is larger in diameter than the contact plug 110.

Figure 5B:
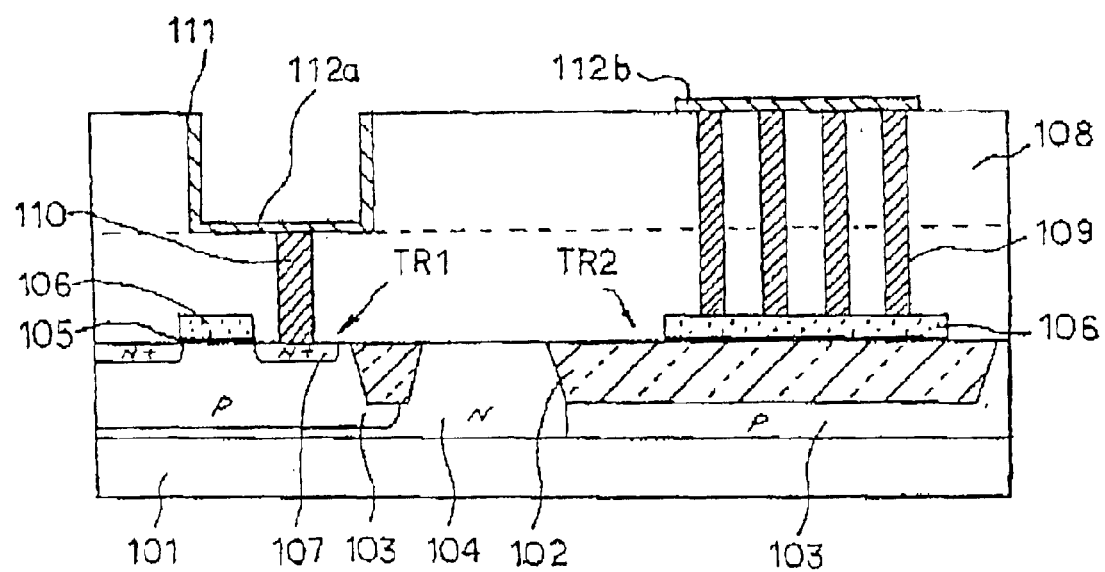

With reference to FIG. 5B, a titanium nitride film 112 having a thickness of 30 nanometers is deposited on the planarized surface of the first inter-layer insulator 108 and also on a side wall and a bottom of the cylinder-shaped large hole 111. A lithography technique and an etching process are carried out to selectively remove the titanium nitride film 112, so that the titanium nitride film 112 remains only on the side wall and a bottom of the cylinder-shaped large hole 111 as well as on a predetermined area of the planarized surface of the first inter-layer insulator 108, whereby a bottom electrode 112a of a cylinder shape is formed within the cylinder-shaped large hole 111, while another bottom electrode 112b of a planer shape is formed on the planarized surface of the first inter-layer insulator 108. The bottom electrode 112a is thus connected through the contact plug 110 to the first transistor TR1 in the DRAM region 1000. The bottom electrode 112b is connected through the contact plugs 109 to the second transistor TR2.

Figure 5C:
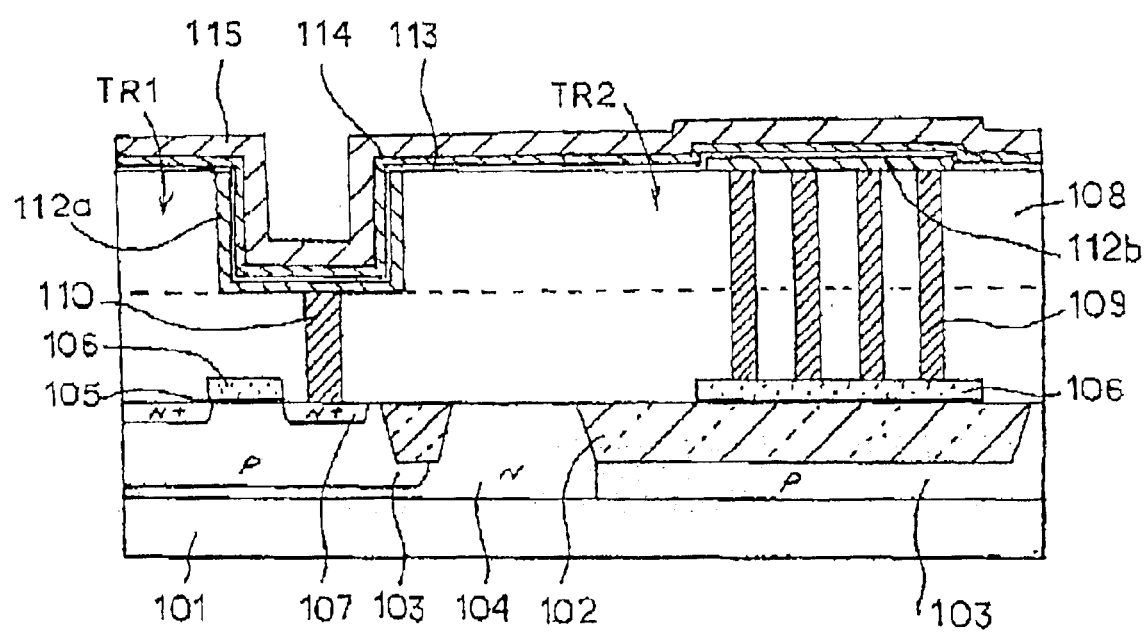

With reference to FIG. 5C, a tantalum oxide film ($Ta_2O_5$) 113 as a capacitive insulation film having a thickness of 16 nanometers is deposited on the top electrodes 112a and 112b and also on the planarized surface of the first inter-layer insulator 108. An titanium nitride film 114 as a lower layer of a double layered top electrode and having a thickness of 30 nanometers is deposited on the tantalum oxide film ($Ta_2O_5$) 113. A tungsten film 115 as a higher layer of a double layered top electrode and having a thickness of 100 nanometers is deposited on the titanium nitride film 114.

Figure 5D:
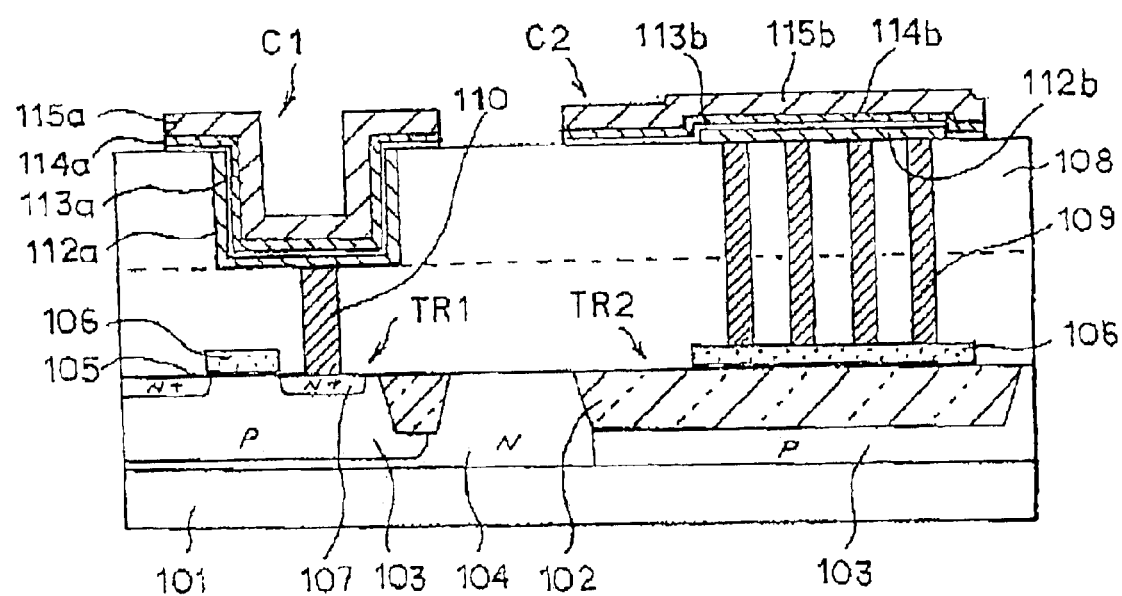

With reference to FIG. 5D, a lithography technique and an etching process are carried out for patterning a lamination structure comprising the tantalum oxide film ($Ta_2O_5$) 113, the titanium nitride film 114 and the tungsten film 115, so that a capacitive insulation film 113a and a top electrode of a double layered structure of the titanium nitride film 114a and the tungsten film 115a are defined, thereby forming a first capacitor C1 of a cylinder shape in the cylinder-shaped large hole 111 in the DRAM region 1000. Further, another capacitive insulation film 113b and another top electrode of the double layered structure of the titanium nitride film 114b and the tungsten film 115b are defined, thereby forming a second capacitor C2 of a planer shape over the first inter-layer insulator 108 in the analogue circuit region 2000.

Figure 5E:
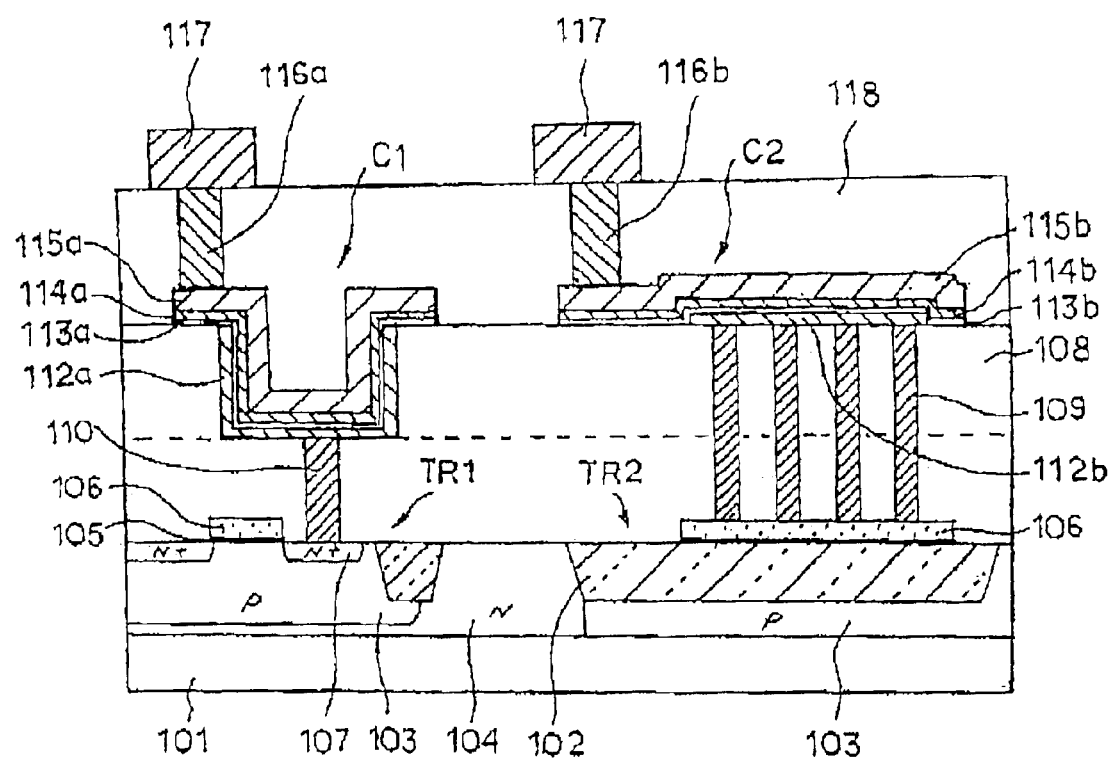

With reference to FIG. 5E, a second inter-layer insulator 118 is deposited over the first and second capacitors C1 and C2 and also over the planarized surface of the first inter-layer insulator 108. A surface of the second inter-layer insulator 118 is also planarized by a chemical mechanical polishing method. Contact holes are formed in the second inter-layer insulator 118, wherein the contact holes are positioned directly over parts of the top electrodes of the first and second capacitors C1 and C2. The contact holes are then filled with tungsten to form contact plugs 116a and 116b which communicate with the top electrodes of the first and second capacitors C1 and C2. Interconnections 117 are formed on the planarized surface of the second inter-layer insulator 118, wherein the interconnections 117 are in contact with the tops of the contact plugs 116a and 166b, so that the interconnections 117 are connected through the contact plugs 116a and 166b to the top electrodes of the first and second capacitors C1 and C2.

As described above, the first and second capacitors C1 and C2 are formed in the same or common processes in the DRAM region 1000 and the analogue circuit region 2000, respectively, thereby to reduce the number of the necessary processes for forming both the first and second capacitors C1 and C2.

Both the first and second capacitors C1 and C2 have the metal-insulator-metal structure in order to reduce respective capacitance dependencies upon applied voltage. The second capacitor C2 is suitable as a capacitive element in the analogue circuit region 2000.

The bottom electrodes 112a and 112b of the first and second capacitors C1 and C2 are electrically connected through the contact plugs 110 and 109 in the first inter-layer insulator 108 to the first and second transistors TR1 and TR2 on the substrate 101, respectively. The top electrodes 115a and 115b of the first and second capacitors C1 and C2 are electrically connected through the contact plugs 116a and 116b in the second inter-layer insulator 118 to the interconnections 117 over the second inter-layer insulator 118. This allows a reduction or minimization in the overlapping area between the top and bottom electrodes of each of the first and second capacitors C1 and C2. This allows a horizontal size reduction of each of the first and second capacitors C1 and C2. This further allows minimization in length of the electrical connections between the top electrodes of the first and second capacitors C1 and C2 to the interconnections 117 and also the other electrical connections between the bottom electrodes of the first and second capacitors C1 and C2 to the first and second transistors TR1 and TR2. The minimization in length of the electrical connections reduces the resistances of the electrical connections, and further reduces the parasitic capacitance of the electrical connections. Namely, this reduces the influence to the capacitance value of each of the first and second capacitors C1 and C2.

Further, the bottom electrode 112b of the second capacitor C2 is connected to the gate electrode 106 of the second transistor TR2 through the plurality of contact plugs 109, which reduces the resistance between the gate electrode 106 of the second transistor TR2 and the bottom electrode 112b of the second capacitor C2, even the gate electrode 106 comprises polysilicon, whereby any improvement in performance of the analogue circuit may be obtained.

Furthermore, the contact plugs 116a and 116b in the DRAM region 1000 and the analogue circuit region 2000 have the same depth, for which reason it is easy to avoid that the contact plugs 116a and 116b penetrate the top electrodes 115a and 155b of the first and second capacitors C1 and C2.

Modifications

In the foregoing embodiments, the present invention is applied to the semiconductor device which integrates the DRAM and the analogue circuit. Notwithstanding, the present invention is also applicable to any semiconductor device which integrates a digital circuit including at least one capacitive element and an analogue circuit including at least one capacitive element.

Further, available materials for the capacitive elements may include, but not limited to, the above described materials as long as the capacitive elements have the metal-insulator-metal structure.

In the foregoing embodiments, both the first and second capacitors C1 and C2 have the above-described desired connection structures, wherein the top electrode is connected with the overlying contact plug in the inter-layer insulator which overlies the top electrode, while the bottom electrode is connected with the underlying contact plug in the underlying inter-layer insulator which underlies the bottom electrode. It is also possible that only the second capacitor C2 in the analogue circuit region 2000 has such the electrical connection structure.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device including:
   at least a digital circuit including at least a first capacitive element of metal-insulator-metal structure, which further comprises a first bottom electrode layer, a first capacitive insulation layer and a first top electrode layer; and
   at least an analogue circuit including at least a second capacitive element of metal-insulator-metal structure, which further comprises a second bottom electrode layer, a second capacitive insulation layer and a second top electrode layer,
   wherein said first and second bottom electrode layers respectively comprise separated two parts derived from a first common metal layer,
   wherein said first and second capacitive insulation layers respectively comprise separated two parts derived from a common insulation layer,
   wherein said first and second top electrode layers respectively comprise separated two parts derived from a second common metal layer,
   wherein said second bottom electrode of said second capacitor is electrically connected with at least a first contact in a first inter-layer insulator which underlies said second bottom electrode,
   wherein said second top electrode of said second capacitor is electrically connected with at least a second contact in a second inter-layer insulator which overlies said second top electrode,
   wherein said first capacitive element comprises a three-dimensional-structured capacitor, and said second capacitive element comprises a planar-structured capacitor,
   wherein said three-dimensional-structured capacitor is provided in a groove formed in said first inter-layer insulator,
   wherein said first and second bottom electrode layers are identical with each other in material and thickness,
   wherein said first and second capacitive insulation layers are identical with each other in material and thickness,
   wherein said first and second top electrode layers are identical with each other in material and thickness, and
   wherein a portion of the first and second top electrodes are substantially coplanar.

2. The semiconductor device as claimed in claim 1, wherein said three-dimensional-structured capacitor comprises a cylinder-shaped capacitor provided in a cylinder-shaped groove formed in said first inter-layer insulator.

3. The semiconductor device as claimed in claim 1, wherein said second bottom electrode is electrically connected with said first contact to a second transistor on a substrate, over which said first inter-layer insulator extends, and said second top electrode is electrically connected with said second contact to a second interconnection extending over a surface of said second inter-layer insulator.

4. The semiconductor device as claimed in claim 1, wherein said first bottom electrode of said first capacitor is electrically connected with at least a third contact in said first inter-layer insulator, and said first top electrode of said first capacitor is electrically connected with at least a fourth contact in said second inter-layer insulator.

5. The semiconductor device as claimed in claim 1, wherein said digital circuit includes DRAM cells.

6. A semiconductor device including:
   at least a digital circuit including at least a first capacitive element of metal-insulator-metal structure, which further comprises a first bottom electrode layer, a first capacitive insulation layer and a first top electrode layer; and
   at least an analogue circuit including at least a second capacitive element of metal-insulator-metal structure, which further comprises a second bottom electrode layer, a second capacitive insulation layer and a second top electrode layer,
   wherein said first and second bottom electrode layers respectively comprise separated two parts derived from a first common metal layer, wherein said first and second capacitive insulation layers respectively comprise separated two parts derived from a common insulation layer, wherein said first arid second top electrode layers respectively comprise separated two parts derived from a second common metal layer, wherein said second bottom electrode of said second capacitor is electrically connected with a plurality of first contact in a first inter-layer insulator which underlies said second bottom electrode, wherein said second top electrode of said second capacitor is electrically connected with at least a second contact in a second inter-layer insulator which overlies said second top electrode.

7. The semiconductor device as claimed in claim 6, wherein said first bottom electrode is electrically connected with a third contact to a first transistor on a substrate, over which said first inter-layer insulator extends, and said first top electrode is electrically connected with a fourth contact to a first interconnection extending over a surface of said second inter-layer insulator.

8. A semiconductor device including:

a semiconductor substrate which includes a digital circuit region and an analogue circuit region;

a first transistor provided on said semiconductor substrate and in said digital circuit region;

a second transistor provided on said semiconductor substrate and in said analogue circuit region;

a first inter-layer insulator overlying said first and second transistors and said semiconductor substrate, and said first inter-layer insulator including a lower half part and an upper half part;

a groove formed in said upper half part of said first inter-layer insulator over said digital circuit region of said semiconductor substrate;

a first capacitive element of a metal-insulator-metal three-dimensional structure in said groove, and said first capacitive element further comprising a first bottom electrode layer, a first capacitive insulation layer and a first top electrode layer;

a first-contact formed in said lower half part of said first inter-layer insulator for providing a first electrical connection between said first bottom electrode layer and said first transistor;

a second capacitive element of a metal-insulator-metal planer structure over said first inter-layer insulator, and said second capacitive element further comprising a second bottom electrode layer, a second capacitive insulation layer and a second top electrode layer;

at least a second contact formed in said lower and upper half parts of said first inter-layer insulator for providing a second electrical connection between said second bottom electrode layer and said second transistor;

a second inter-layer insulator overlying said first and second capacitive elements and said first inter-layer insulator;

first and second interconnections extending over said second inter-layer insulator;

a third contact formed in said second inter-layer insulator for providing a third electrical connection between said first top electrode and said first interconnection; and a fourth contact formed in said second inter-layer insulator for providing a fourth electrical connection between said second top electrode and said second interconnection, wherein said first and second bottom electrode layers respectively comprise separated two parts derived from a first common metal layer, wherein said first and second capacitive insulation layers respectively comprise separated two parts derived from a common insulation layer, wherein said first and second top electrode layers respectively comprise separated two parts derived from a second common metal layer.

9. The semiconductor device as claimed in claim 8, wherein said first capacitor comprises a cylinder-shaped capacitor provided in a cylinder-shaped groove formed in said upper half part of first inter-layer insulator.

10. The semiconductor device as claimed in claim 8, wherein said first and second bottom electrode layers are identical with each other in material and thickness, wherein said first and second capacitive insulation layers are identical with each other in material and thickness, wherein said first and second top electrode layers are identical with each other in material and thickness.

11. The semiconductor device as claimed in claim 8, wherein said second bottom electrode of said second capacitor is electrically connected with a plurality of said second contact in said first inter-layer insulator.

12. The semiconductor device as claimed in claim 8, wherein said digital circuit includes DRAM cells.

* * * * *